US010141394B2

(12) United States Patent
Detalle (10) Patent No.: US 10,141,394 B2
(45) Date of Patent: Nov. 27, 2018

(54) INTEGRATED CIRCUIT COMPRISING A METAL-INSULATOR-METAL CAPACITOR AND FABRICATION METHOD THEREOF

(71) Applicant: IMEC VZW, Leuven (BE)

(72) Inventor: Mikael Detalle, Limal (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/360,859

(22) Filed: Nov. 23, 2016

(65) Prior Publication Data
US 2017/0148869 A1    May 25, 2017

(30) Foreign Application Priority Data

Nov. 25, 2015 (EP) ..................................... 15196277

(51) Int. Cl.
*H01L 49/02* (2006.01)
*H01L 23/522* (2006.01)

(52) U.S. Cl.
CPC .......... *H01L 28/91* (2013.01); *H01L 23/5223* (2013.01); *H01L 28/92* (2013.01); *H01L 2224/0401* (2013.01); *H01L 2224/16145* (2013.01); *H01L 2224/16227* (2013.01); *H01L 2924/14* (2013.01)

(58) Field of Classification Search
None
See application file for complete search history.

(56) References Cited

U.S. PATENT DOCUMENTS

| | | | |
|---|---|---|---|
| 2005/0266652 A1 | 12/2005 | Chudzik et al. | |
| 2008/0050874 A1 | 2/2008 | Won et al. | |
| 2008/0291649 A1* | 11/2008 | Mashino | H01G 4/236 361/763 |
| 2010/0020509 A1* | 1/2010 | Xie | H01G 4/33 361/748 |
| 2010/0308435 A1 | 12/2010 | Nowak et al. | |
| 2012/0211865 A1* | 8/2012 | Tian | H01L 27/0805 257/532 |

(Continued)

FOREIGN PATENT DOCUMENTS

WO  WO 2007/054858 A2   5/2007
WO  WO 2011/057238 A2   5/2011

*Primary Examiner* — Su C Kim
*Assistant Examiner* — David S Wilbert
(74) *Attorney, Agent, or Firm* — Knobbe, Martens, Olson & Bear LLP (57) ABSTRACT

The disclosed technology relates to a metal-insulator-metal capacitor (MIMCAP) integrated as part of a back-end-of-line of an integrated circuit (IC). In one aspect, a MIMCAP comprises a first planar electrode having perforations formed therethrough, and a metal-insulator-metal (MIM) stack lining inner surfaces of cavities formed in the perforations and extending into the substrate. The MIMCAP additionally comprises a second electrode having a planar portion and metal extensions extending from the planar portion into the cavities. The first electrode and the planar portion of the second electrode are formed of or comprise planar metal areas of the respective metallization levels, which can be formed by a damascene process, which allows for a reduction of the series resistance. A low aspect ratio can be obtained using one electrode having a 3D-structure (the electrode having extensions extending into the cavities).

9 Claims, 6 Drawing Sheets

(56) References Cited

U.S. PATENT DOCUMENTS

2014/0367828 A1 12/2014 Colonna et al.
2014/0374880 A1 12/2014 Chen et al.
2015/0179731 A1 6/2015 Lasiter et al.

* cited by examiner

INTEGRATED CIRCUIT COMPRISING A METAL-INSULATOR-METAL CAPACITOR AND FABRICATION METHOD THEREOF

CROSS-REFERENCE TO RELATED APPLICATIONS

This application claims foreign priority to European Application No. 15196277.6, filed Nov. 25, 2015, the content of which is incorporated by reference herein in its entirety.

BACKGROUND

Field

The disclosed technology generally relates to integrated circuit devices, and more particularly to a metal-insulator-metal capacitor integrated as part of a back-end-of-line (BEOL) of the integrated circuit devices.

Description of the Related Technology

The physical scaling of device dimensions in CMOS technology continues to enable faster computing speeds, lower power consumption, higher device densities and/or lower cost, among other benefits. However, such benefits of physical scaling are often realized with increasing challenges and trade-offs. For example, in the fabricated device, large current spikes may occur due to a large number of 'simultaneous' switching events in the circuit within a short period of time, which can cause considerable current-resistance drop and noise over the power supply network. Voltage fluctuation and power supply noise may impact signal integrity, speed and reliability of the fabricated devices. Under some circumstances, an on-chip decoupling MIM-CAP (metal-insulator-metal capacitor) can alleviate this and other problems and enhance circuit performance. For example, an on-chip MIMCAP can compensate voltage fluctuations by delivering charges to the power-supply network. However, integrating such MIMCAPs having desirable electrical properties without unacceptably increasing the overall footprint of the integrated circuit poses many challenges. For example, to increase the capacitance and thereby enhance the device performance, the thickness of the dielectric can be decreased, or alternatively a higher-k dielectric can be used. However, both of these approaches to increasing capacitance can be accompanied by an increase in leakage currents, a decrease in breakdown voltage and/or a deterioration of voltage linearity, among other possible undesirable results. To mitigate these undesirable effects, the MIMCAPs can be three-dimensionally integrated, e.g., to increase effective MIM area and related capacitance density. However, for high frequency applications, the efficiency of a capacitor is largely dependent on its serial resistance, which can depend on, e.g., how the capacitor is connected to the circuit.

Present-day approaches to lowering the series resistance include doping of silicon areas in contact with the MIMCAP. However, this approach cannot reach the low resistance values of a metal (Cu) connection. Integration of 3D-MIM-CAPs into a BEOL process has been described, e.g. in US20050266652 and US20080050874. However, these techniques involve 3-dimensional patterning of both the bottom and top electrode of the MIMCAP, which is a complex process which poses undesirable limits on the aspect ratio of the 3D structures, thereby limiting the achievable capacitance density.

SUMMARY OF CERTAIN INVENTIVE ASPECTS

The disclosed technology relates to an integrated circuit comprising a MIMCAP and to methods of fabrication thereof, as disclosed in the appended claims. In the present context, a MIMCAP is a structure comprising a metal-insulator-metal (MIM) stack, i.e. a stack of a lower electrically conductive layer, an upper electrically conductive layer and an insulator layer sandwiched between the two conductive layers, and further comprising a bottom and top electrode, the bottom electrode being in electrical contact and at least partially in physical contact with the lower conductive layer, the top electrode being in electrical and at least partially in physical contact with the upper conductive layer. According to the embodiments, a MIMCAP is integrated in a BEOL metallization stack built on a semiconductor substrate. The MIMCAP according to the embodiments comprises a first planar electrode provided with perforations, a MIM stack lining the inner surface of deep cavities formed in the perforations and reaching into the substrate, and a second electrode having a planar portion and metal extensions extending from the planar portion into the cavities. The first electrode and the planar portion of the second electrode are formed of or comprise planar metal areas of the respective metallization layers, obtainable by standard damascene processing. This allows for a reduction in series resistance. A low aspect ratio is obtainable given that only one electrode comprises a 3D-structure (the electrode having extensions extending into the cavities).

In a first aspect, an integrated circuit (IC) comprises a semiconductor substrate and a metallization stack. The metallization stack comprises a plurality of metallization levels or layers, where each metallization level, or each metallization layer, comprises a layer of intermetal dielectric with metal areas embedded therein. The IC further comprises a metal-insulator-metal capacitor (MIMCAP) comprising a bottom electrode, a top electrode and a metal-insulator-metal (MIM) stack comprising a lower conductive layer, an upper conductive layer and an insulator layer sandwiched between the lower and upper conductive layers. The bottom electrode comprises at least a planar metal area of a lower metallization layer, where the metal area is provided with perforations. The IC further comprises cavities, where each cavity extends through one of the perforations and into the semiconductor substrate, where each cavity is separated from the edges of the corresponding perforation by intermetal dielectric material (IMD1) of the lower metallization level. The MIM stack comprises a planar portion on at least part of an upper surface of the bottom electrode and a plurality of non-planar portions extending downward into the cavities, such that the MIM stack lines the sidewalls and bottoms of the cavities. The top electrode comprises: a planar portion formed by a planar metal area of an upper metallization level directly adjacent to the lower metallization level, where the planar portion of the top electrode is formed on at least part of an upper surface of the planar portion of the MIM stack, and non-planar portions extending downward from the planar portion of the top electrode into the cavities. The cavities are thus filled by portions of the MIM stack lining the walls and bottom of the cavities and by the non-planar extensions.

According to an embodiment, the planar portion of the top electrode is equally provided with perforations, each perforation having a central portion of intermetal dielectric material of the upper metallization level, the side wall of the central portion being surrounded by the MIM stack.

According to an embodiment, a part of the substrate that comprises the MIMCAP is isolated from the remainder of the substrate by a dielectric wall portion that is laterally enclosing the portions of the cavities which extend into the substrate.

According to an embodiment, the bottom electrode further comprises an additional layer of a conductive material on top of the planar metal area of the lower metallization level, the additional layer being equally provided with perforations corresponding to the perforations in the planar metal area.

According to an embodiment, a portion of the bottom electrode extends beyond the top electrode and the extended portion of the bottom electrode is contacted by a via connection in the upper metallization level.

According to an embodiment, the IC is provided with a power delivery network, and the MIMCAP is a decoupling capacitor coupled between a supply terminal and a ground terminal of the network. According to an embodiment, the IC comprises a DC/DC converter, and the MIMCAP is part of the DC/DC converter. According to an embodiment, the IC is an interposer chip. According to an embodiment, the lower and upper metallization levels are the first and second metallization levels of the metallization stack.

According to an embodiment, the planar portion of the top electrode has side walls lined by portions of the MIM stack.

In a second aspect, a method for fabricating an IC comprises a metal-insulator-metal capacitor (MIMCAP). The method comprises forming a first intermetal dielectric layer on a semiconductor substrate, and patterning the first IMD layer within a first boundary so as to remove the first IMD layer within the first boundary except in a number of discrete areas. The method additionally comprises depositing a metal within the first boundary and planarizing the metal, thereby forming a first metallization level, or a first metallization layer, comprising a first planar metal area, having a plurality of discrete perforations filled with the discrete areas of the first IMD layer; forming a second IMD layer on the first metallization level, and patterning the second IMD layer so as to remove at least partially the second IMD layer within a second boundary, thereby exposing an area that includes the perforations; etching cavities through the discrete areas of the first IMD layer and spaced from the edges of the perforations in the first planar metal area, the cavities extending into the substrate; forming a metal-insulator-metal stack, the MIM stack lining the sidewalls and bottom of the cavities, and covering the second IMD layer and the exposed area; depositing metal on the MIM stack thereby filling the cavities with the metal, thereafter planarizing the metal, thereby forming a second metallization level, comprising a second planar metal area provided with non-planar extensions extending into the cavities, the second planar metal area and the extensions forming at least part of the top electrode of the MIMCAP and the first planar metal area forming at least part of the bottom electrode of the MIMCAP; and forming contacts for electrically contacting the bottom and top electrodes.

According to an embodiment of the method, the first planar metal area comprises a portion extending beyond the second planar metal area and the process of producing contacts comprises the process of producing a via connection in the upper metallization level, to the extended portion.

According to an embodiment, the method comprises the additional process, performed after the formation of the first planar metal area and before the production of a second IMD layer, of depositing and patterning a conductive layer on the first planar metal area, the conductive layer being patterned within the first boundary to have corresponding perforations to the perforations of the first planar metal area, the bottom electrode being formed by the first planar metal area and the conductive layer.

According to an embodiment of the method, the second IMD layer is partially removed within the second boundary, thereby forming a number of discrete areas, such that the second planar metal area is provided with a plurality of discrete perforations comprising the discrete areas of the second IMD layer, the sidewalls of the discrete areas being surrounded by the MIM stack.

According to an embodiment, the method further comprises the process of etching a trench in the substrate around the MIMCAP, from the back of the substrate, and filling the trench with an isolating material, thereby isolating a part of the substrate that comprises the MIMCAP from the remainder of the substrate by a dielectric wall portion that is laterally enclosing the portions of the cavities which extend into the substrate.

According to an embodiment, the process of etching a trench and filling the trench with an isolating material are integrated in a via-last process.

According to an embodiment, the MIM stack is deposited in said exposed area so as to line the sidewalls of the second IMD layer along the second boundary, and so that after deposition and planarization of metal on the MIM stack, the second planar metal area has side walls lined by portions of the MIM stack.

DETAILED DESCRIPTION OF CERTAIN ILLUSTRATIVE EMBODIMENTS

Figure 1A:
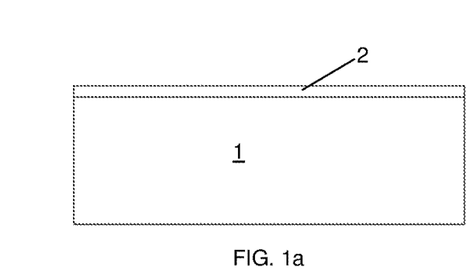
FIGS. 1a to 1s illustrate intermediate structures at various stages of fabricating a metal-insulator-metal capacitor (MIMCAP), according to embodiments.
Figure 1B:
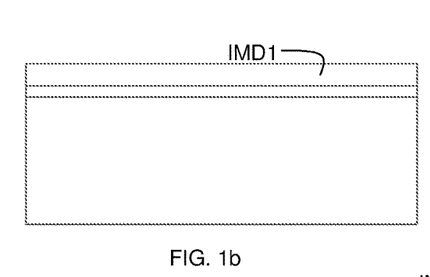
Figure 1C:
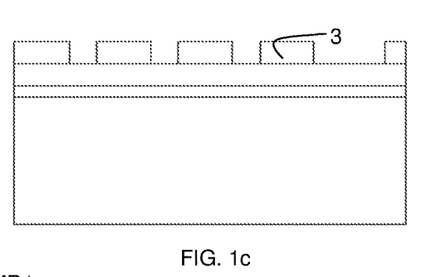
Figure 1D:
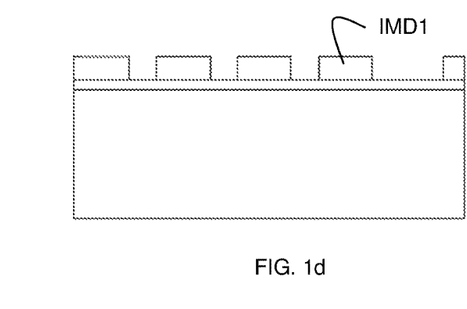
Figures 1E, 1F:
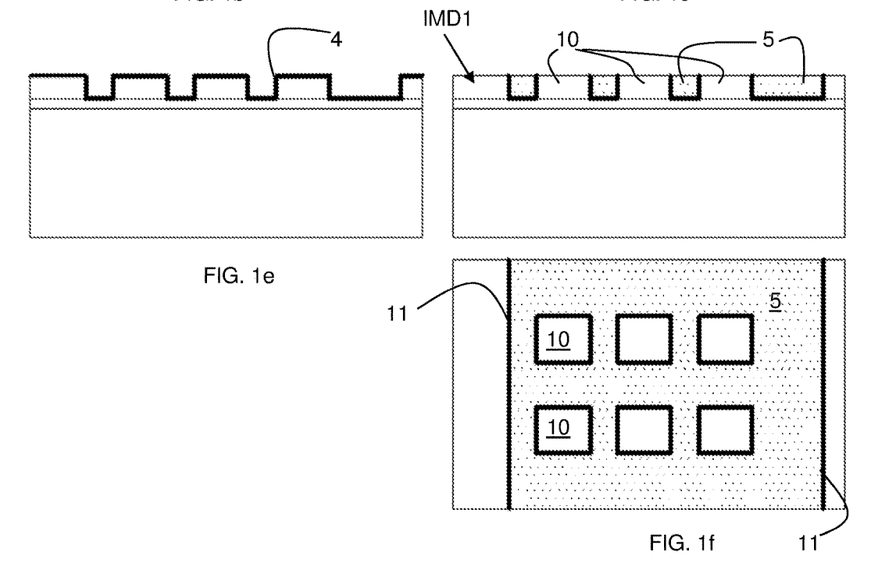
Figure 1G:
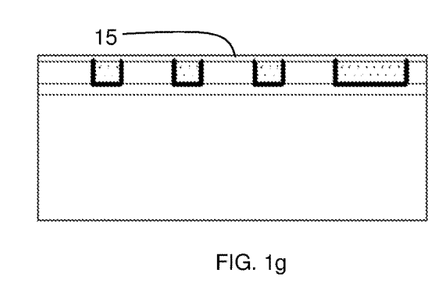
Figures 1H, 1I, 1K, 1L:
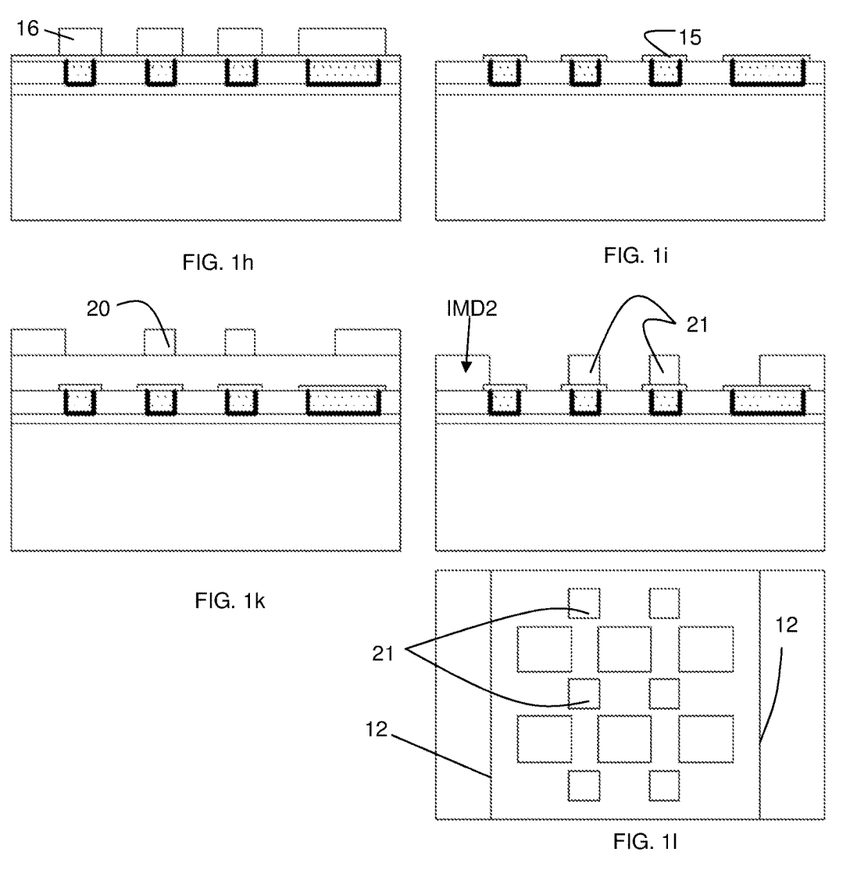
Figure 1J:
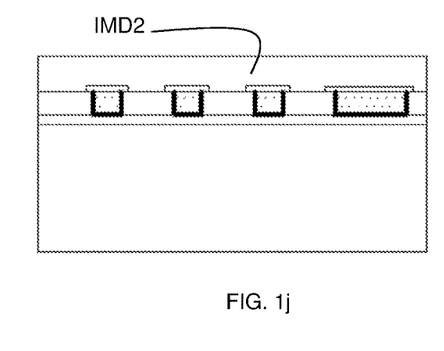
Figures 1M, 1N, 1O:
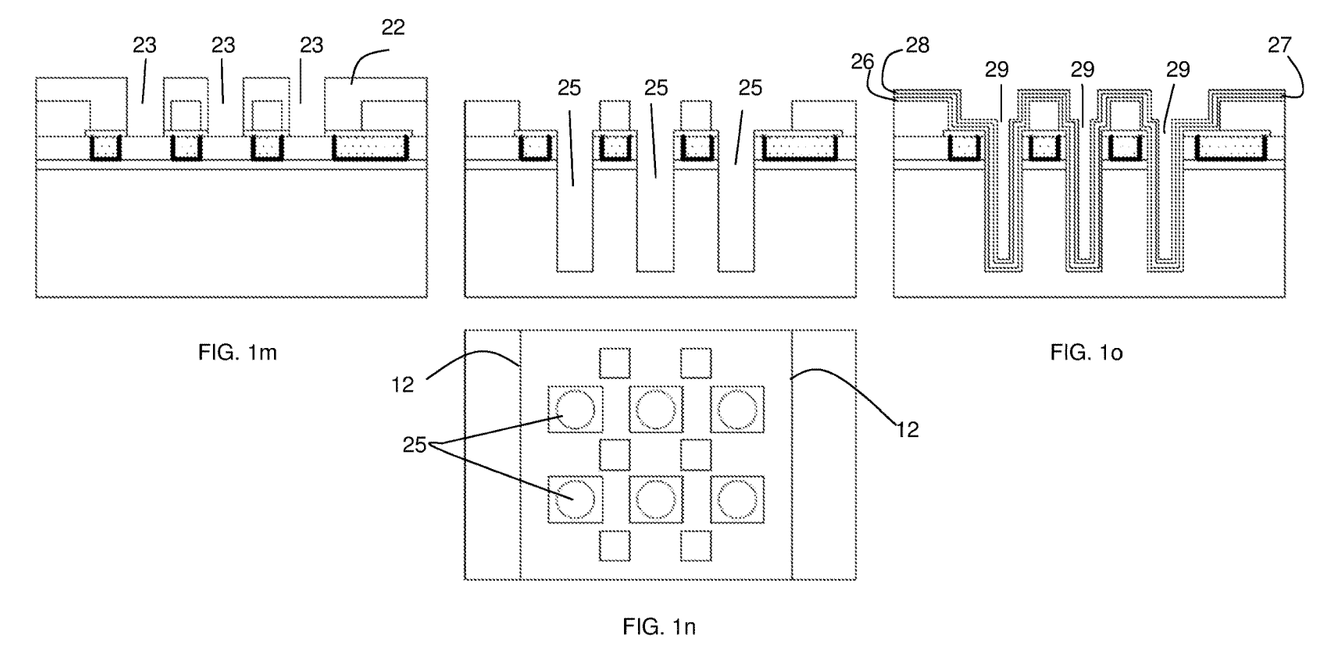
Figures 1P, 1Q:
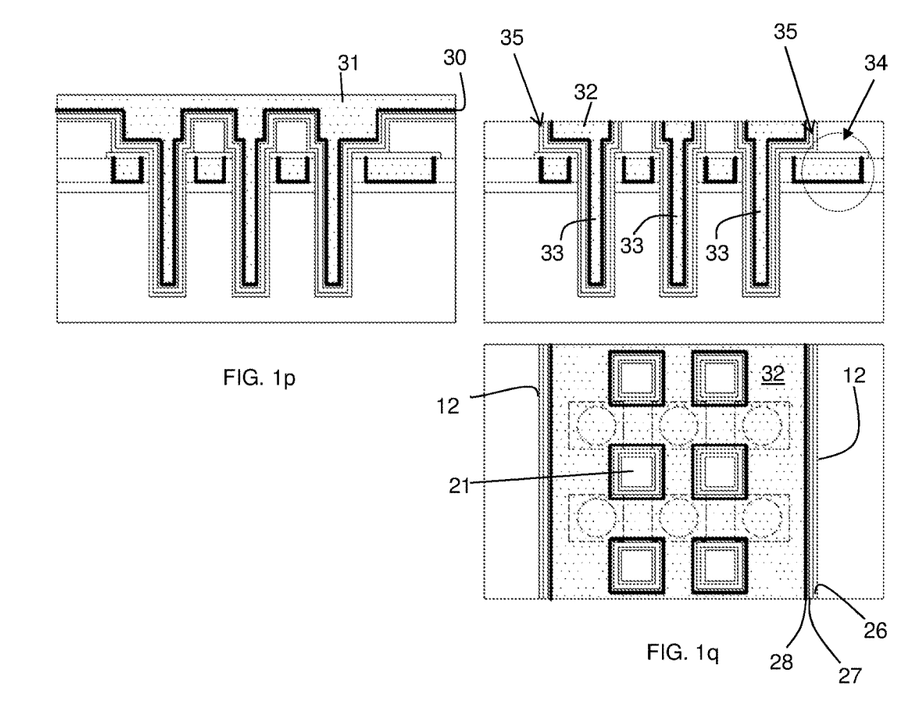
Figure 1R:
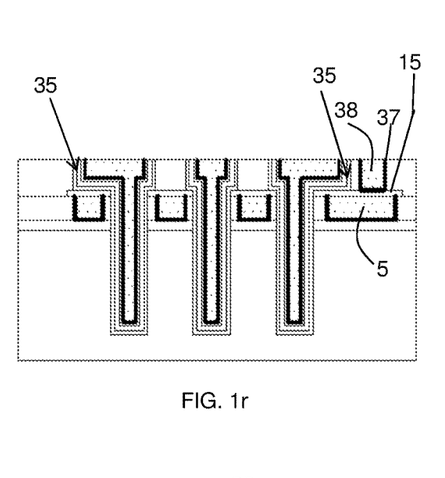
Figure 1S:
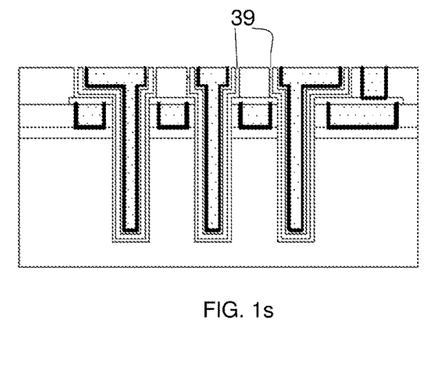

FIGS. 1a to 1s illustrate a method of fabricating an integrated circuit (IC) comprising a MIMCAP, according to an embodiment of the disclosed technology. The method is performed on a semiconductor substrate 1. According to various embodiments disclosed herein, the MIMCAP is integrated with one or more metallization levels of the IC, e.g., in first (M1) and second (M2) metallization levels in a back end of line (BEOL) process performed on the semiconductor substrate 1. As described herein and throughout the specification, a metallization level refers to an interconnection level of an IC which includes conductive interconnection structures as well as intermetal dielectrics formed between the conductive interconnection structures. An nth metallization level refers to one of metallization levels of the IC having a plurality of metallization levels, where n indicates a relative proximity of the conductive interconnection structures relative to semiconductor substrate 1. For example, a first metallization level (M1) refers to an interconnection level that is closer to the substrate 1 than a second metallization level (M2). However, a first metallization level (M1) does not exclude the possibility that additional metallization level(s) may exist between the M1 and the substrate 1. For example, a zeroth metallization level (M0) may be formed between M1 and the substrate 1.

The drawings are for illustrative purposes only and are not drawn to the scale of the actual structures. The substrate 1 is preferably a silicon wafer, but it may be any type of semiconductor material. It may or may not comprise front-end-of-line processed semiconductor components. According to some embodiments, the substrate is a silicon substrate to be used as an interposer. As described herein, an interposer includes, a substrate onto which one or more integrated circuit chips can be mounted. The interposer is configured such that mounted IC chips can be connected to other components, e.g., a power supply, through one or more through silicon via (TSV) connections that are formed through the interposer. It can be advantageous to form a MIMCAP according to embodiments on such an interposer, as will be explained below. However, embodiments are not so limited and the embodiments describe with respect to FIGS. 1*a* to 1*s* can be applicable to any type of substrate 1 that is not an interposer.

In a first process, a pre-metal dielectric (PMD) layer 2 is deposited on the substrate 1 (FIG. 1*a*), the PMD layer being a layer suitable for producing thereon a metallization stack. The dielectric material and the application method used for this layer 2 may be according to known methods for depositing a PMD layer. As described herein, a metallization stack refers to a stack of metallization levels, where each metallization level, or each metallization layer, comprises a dielectric layer in which metal areas embedded therein. The metal areas may be planar areas, metal lines or metal vertical (so-called via) connections. The various levels of a metallization stack are indicated by their relative distance from the substrate 1, e.g., M1, M2, etc., where a lower metallization level is closer to the substrate 1 compared to a higher metallization level. Metallization levels of this type can be fabricated using single or double damascene processes.

As described herein, the dielectric layers into which the metal conductors are embedded are referred to as intermetal dielectric (IMD) layers. The production of a PMD and subsequent metallization levels M1, M2, etc., is commonly referred to as the back-end-of-line process (BEOL).

As described herein, a damascene process, or a single damascene process, is used to describe a process consistent with the usage of the term in the relevant industry. As consistent with the usage of the term in the relevant industry, a damascene process for forming a metallization level refers to an additive process in which an IMD layer is deposited and etched using a photolithographic process. Prior to deposition of a metal, a barrier layer and/or a seed layer may be deposited by, e.g., physical vapor deposition (PVD) on the patterned dielectric layer. Subsequently, a metal, e.g., copper, may be deposited by, e.g., electroplating, and planarized using, e.g., chemical mechanical polishing (CMP), thereby forming conductive structures such as metal lines that are electrically insulated by and embedded within the patterned IMD layer. These processes may be repeated n number of times for fabrication of n metallization levels.

As described herein, a dual damascene process is used to describe a process consistent with the usage of the term within the relevant industry. A dual damascene process is similar to a single damascene process, except that both lines and vias are formed by etching holes and trenches in the IMD layer, prior to depositing the metal. One photolithographic process may be used to form holes (vias) in the dielectric to make connection with underlying metal, and another photolithographic process may be used to form trenches for the metal lines. Subsequently, a metal, e.g., copper, may be deposited by, e.g., electroplating, and planarized using, e.g., chemical mechanical polishing (CMP), thereby forming conductive structures including metal lines and vias embedded within the patterned IMD layer. These processes may be repeated n number of times for fabrication of n metallization levels.

As illustrated in FIG. 1*b*, a first intermetal dielectric layer IMD1 is deposited onto the PMD layer 2. FIGS. 1*c* to 1*f* illustrate process of a damascene process: forming a lithographic mask 3, by depositing and photopatterning a patterning layer, e.g., a photoresist layer and/or a hardmask layer, etching the IMD1 layer according to the litho-mask 3, stripping the litho-mask 3, depositing a barrier and seed layer 4, electroplating a metal 5 (preferably Cu) onto the barrier/seed layer 4 thereby filling the areas removed by the etching process with metal, performing a planarizing process (e.g., by chemical mechanical polishing—CMP), thereby planarizing the metal and removing the barrier/seed 4 from the upper surface of the IMD1 layer. As seen in the top view of FIG. 1*f*, the pattern defined by the litho-mask 4 comprises discrete areas 10 where the IMD1 layer remains, whereas all the IMD1 material around these discrete areas is removed within a well-defined boundary 11 (only the side edges 11 of the boundary are shown). The metal area created by the damascene process is therefore a planar metal area 5, hereafter referred to as a metal plate 5, with discrete perforations 10 filled with IMD1 material. The metal plate 5 will form at least part of the planar bottom electrode of the MIMCAP. As known in the art, the IMD1-filled perforations 10 have the function of maintaining a flat surface of the plate 5 during CMP planarization, i.e. avoiding the dishing effect occurring when planarizing a large area. The perforations 10 obtain an additional function in the construction of the MIMCAP according to embodiments, as described below.

In an optional number of processes shown in FIGS. 1*g* to 1*i*, a conductive layer 15 is deposited and patterned by a second litho-mask 16, in order to cover the perforated metal plate 5 with this conductive layer 15, leaving openings in the conductive layer 15 at the position of the perforations 10. When the metal of the metal plate 5 is Cu, the conductive layer 15 may be TaN or TiN. It is applied in order to avoid landing directly on Cu in subsequent etching process, this to avoid Cu contamination of the etch chamber. When layer 15 is used, the bottom electrode of the MIMCAP is formed by the layers 5 and 15 taken as a whole.

Then a second IMD layer IMD2 is deposited (FIG. 1*j*) and patterned by application of a third litho-mask 20, by etching the IMD2 layer in areas exposed by the mask and by stripping the mask (FIG. 1*k* and 1*l*). As seen in the top view of FIG. 1*l*, the litho mask 20 defines a pattern wherein all the IMD2 material is removed within a boundary 12 except for discrete islands 21 of IMD2 material located in between the perforations 10 in the bottom electrode 5/15, leaving the bottom electrode exposed within the boundary 12, except for the discrete islands 21.

Then a fourth litho-mask 22 is formed which covers the whole surface except for a number of openings 23, each opening being situated above a perforation 10 in the metal plate 5 (FIG. 1*m*). The openings 23 may have a circular cross-section and are preferably placed centrally with respect to the boundaries of each perforation 10. A deep semiconductor etch process is then performed, etching through the IMD1 layer, the PMD layer 2 and the semiconductor substrate 1, to create deep cavities 25, after which the fourth litho mask 22 is stripped (FIG. 1*n*). The cavities 25 are spaced from the edges of the perforations 10 in the metal plate 5. IMD1 material separates the cavities from these edges of the perforations.

Then a deposition is performed of three consecutive layers (FIG. 1o): a lower electrically conductive layer 26, a middle electrically insulating layer 27 and an upper electrically conductive layer 28, these three layers forming a metal-insulator-metal stack as known as such in the art. The conductive layers 26 and 28 may for example be Ta, TaN, Ti or TiN. The dielectric 27 of the MIM stack may be $SiO_2$, silicon nitride ($Si_3N_4$), silicon carbide, $Ta_2O_5$, $HfO_2$, $TiO_2$, or another suitable material. The MIM stack is formed so as to cover the IMD2 layer and the exposed area of the bottom electrode 5/15 within the boundary 12, and to line the sidewalls and bottom of the cavities 25. In other words, the MIM stack comprises a planar portion on the upper surface of the bottom electrode and a plurality of non-planar portions extending in the cavities. The three layers 26/27/28 are preferably deposited by a conformal deposition technique, i.e. a technique wherein the deposited layers closely follow the topography of the surface on which they are deposited. In the embodiment shown in the drawings, this means that the MIM stack 26/27/28 follows the topography defined by the IMD2 islands 21 and the edges of the IMD2 layer along the boundary 12. The layers of the MIM stack may be deposited by Atomic Layer Deposition for example. The diameter of the cavities 25 and the thickness of the applied MIM stack layers 26/27/28 is chosen so that a central opening 29 remains in the cavities after application of the MIM stack layers. After deposition of a seed layer 30, a second metal layer 31 is deposited by electroplating, the metal filling the openings 29 and forming a layer on top of the MIM stack 26/27/28 which conformally covers the IMD2 islands 21 and the exposed area between said islands (FIG. 1p). This is followed by a CMP process (FIG. 1q) wherein the metal layer 31 is planarized and the MIM stack 26/27/28 is removed from the upper surface of the IMD2 layer. The islands 21 of IMD2 material ensure that the planarization does not cause a dishing effect of the metal layer 31. As seen in the top view illustrated in FIG. 1q, the planarization results in the formation of a planar metal area 32 (hereafter referred to as metal plate) 32 in level M2 of the BEOL stack, the plate 32 being located within the boundary 12, the plate being provided with perforations, each perforation comprising a central IMD2 island 21 the side walls of which are surrounded by the MIM stack layers 26/27/28, i.e. portions of the MIM stack are lining the side walls of the islands 21. The outer side walls of the plate 32 are equally lined with portions 35 the MIM stack 26/27/28. The metal plate 32 is furthermore provided with metal extensions 33 reaching down through the perforations 10 of the plate 5 in level M1. The metal plate 32 with extensions 33 will form at least a part of the upper electrode of the MIMCAP. In the embodiment shown in the drawings, the boundary 12 is sized with respect to the boundary 11 so that the bottom electrode 5/15 extends outward from the MIM stack 26/27/28 and the top electrode in an area 34. As explained hereafter, this extended portion 34 may be used for contacting the bottom electrode. The embodiments is however not limited to the shape, size and location of the second boundary 12 relative to the first boundary 11 as shown in the drawings. Generally, the boundary 12 is overlapping boundary 11 at least on an area comprising the perforations 10 in the bottom electrode. The boundary 12 may have the same shape and size as the lower boundary 11 and be aligned to said lower boundary, resulting in an equal-sized and aligned top and bottom electrodes. This would require another way of contacting the bottom electrode, instead of by an extended portion 34, e.g. by a conductor line in the M1 layer. Another alternative is an upper boundary 12 that has the same shape and similar size as the lower boundary 11 but that is shifted laterally with respect to the lower boundary 11. Yet another alternative is an upper boundary 12 that is larger than the lower boundary 11. The last two alternatives would result in the MIM stack 26/27/28 extending outward laterally with respect to the bottom electrode at least to one side of the bottom electrode.

At this point the MIMCAP is formed, having a bottom planar electrode 5/15, a 3D MIMCAP portion 26/27/28 and a top electrode, the top electrode having a planar portion 32 in the M2 layer and extensions 33 reaching down into the substrate 1. The 3D aspect of the MIMCAP allows for an increase in the capacitor area compared to a planar MIMCAP and compared to existing 3D MIMCAP designs. The series resistance of the MIMCAP is low given that the bottom and top electrodes consist of or comprise large metal areas incorporated in the M1 and M2 layers.

In the embodiment shown in the drawings, and as a consequence of the described process sequence, the planar portion 32 of the top electrode covers fully the planar portion of the MIM stack 26/27/28, and the MIM stack further comprises vertical wall portions 35 which line the side walls of the top electrode's plate portion 32. Alternative embodiments are possible wherein the planar portion 32 is smaller than the planar portion of the MIM stack, e.g. due to additional processes performed between the MIM formation and the second metal deposition. Also the MIMCAP according to embodiments could be formed without the MIM wall portions 35, e.g. by including a process wherein these portions are removed.

FIG. 1r shows a preferred way of producing a contact to the bottom electrode 5/15 of the MIMCAP, by a standard damascene process: applying a litho-mask (not shown), etching an opening through the IMD2 layer, depositing a barrier/seed layer 37 and electroplating+planarizing the electroplated metal, thereby creating a contact via 38, contacting the bottom electrode 5/15 on the extended portion 34. Optionally (FIG. 1s), a recess etch of the conductive layers 26/28 of the MIM stack may be performed, forming recesses 39 at the surface, in order to avoid shorting of the capacitor due to metal residues that are left on the surface.

Figure 2A:
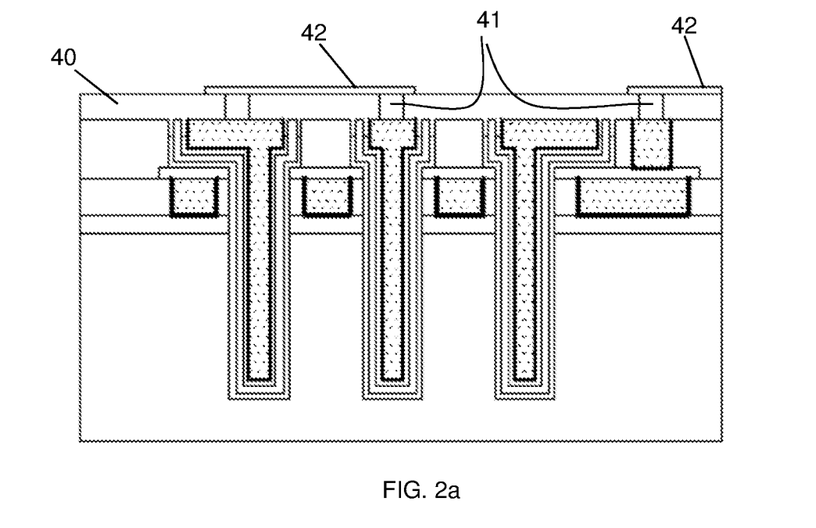
FIGS. 2a and 2b illustrate intermediate structures at various stages of electrically contacting a MIMCAP, according to embodiments.
Figure 2B:
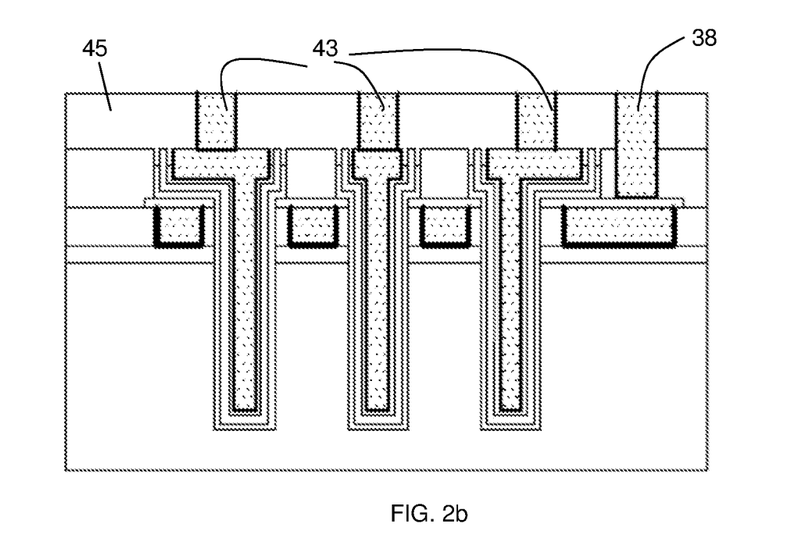

As shown in FIG. 2a, a passivation layer 40 may be formed and patterned onto the structure shown in FIG. 1s, so as to form connections 41 to the MIMCAP's bottom and top electrodes, see FIG. 2a. Contact pads 42 may then be formed on top of the substrate, configured to receive further contact structures such as bumps or pillars. Possibly further BEOL-metallization levels M3, M4, . . . may be formed on top of the structure shown in FIG. 1s, before producing passivation layer 40 on top of the finished metallization stack. According to an embodiment illustrated in FIG. 2b, the production of the contact via 38 takes place together with the production of contact vias 43 in a further IMD layer 45.

As stated, the MIMCAP according to certain embodiments may be formed on any type of semiconductor substrate. One particular field of application is the building of decoupling capacitors in the power delivery network of an interposer substrate. The M1 and M2 levels described above are then coupled to a supply voltage and to ground respectively. The MIMCAP is designed to be able to compensate a voltage drop due to switching action of CMOS circuitry in the chips mounted on the interposer. The MIMCAP according to embodiments is also applicable for the building of DC/DC convertors on an interposer. An interposer according to embodiments is to be regarded as an integrated circuit. The MIMCAP of embodiments may be integrated in the production of any pair of adjacent metallization levels $M_n$, $M_{n+1}$ of a metallization stack. If formed between layers higher up than M1 and M2, the underlying layers must be designed suitably in order to allow the production of the cavities 25 through these underlying layers. No metal conductors can be present in these underlying layers at the position of the cavity areas.

Figure 3A:
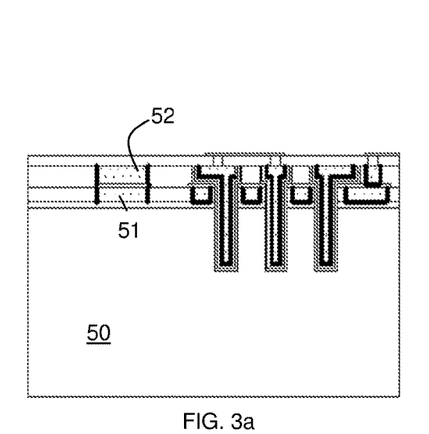
FIGS. 3a to 3f illustrate a intermediate structures at various stages of electrically isolating a MIMCAP according embodiments.
Figure 3B:
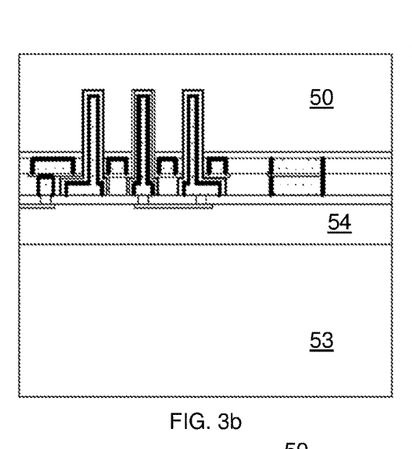
Figure 3C:
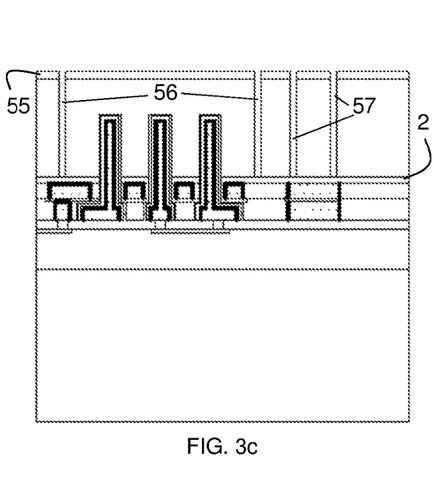
Figure 3D:
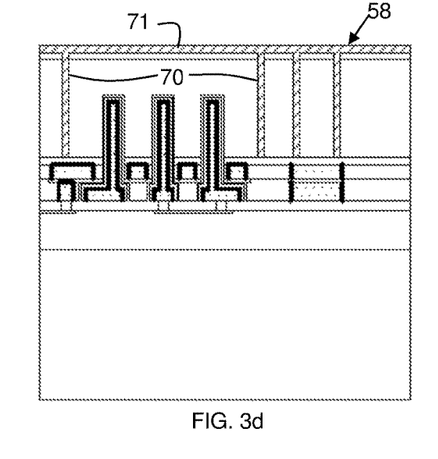
Figure 3E:
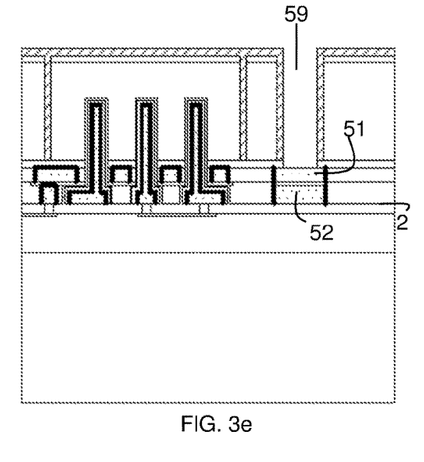
Figure 3F:
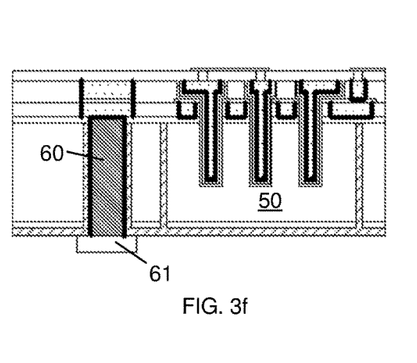

When building multiple MIMCAPs according to embodiments on the same substrate, it is preferred to provide isolation between adjacent MIMCAPs. For example when adjacent MIMCAPs are coupled to different supply voltages, care must be taken to avoid shorting paths through the silicon substrate. One preferred way of isolating MIMCAPs according to embodiments is illustrated in FIG. 3. FIG. 3a shows the MIMCAP according to embodiments, formed on an interposer substrate 50. The substrate furthermore comprises metal areas 51/52 in the M1/M2 levels which are in electrical contact with each other. The substrate 50 is temporarily attached to a carrier substrate 53, by attaching it to the carrier through a releasable glue layer 54. The substrate is then thinned by a suitable grinding technique (FIG. 3b), e.g. from a thickness of about 775 µm to about 50-100 µm. Then a dielectric passivation layer 55 is applied, e.g. SiN (FIG. 3c). By a litho and etch process, a pattern of trenches is then etched in the substrate, stopping on the PMD layer 2 (FIG. 3c). These trenches comprise a trench 56 that encloses the MIMCAP, and a circular trench 57 aligned with the metal areas 51/52. The trenches are then filled with an electrically insulating material 58 (FIG. 3d), preferably a polymer material, deposited inside the trenches and on top of the substrate, thereby effectively isolating the part of the substrate where the MIMCAP is situated from the remainder of the substrate by a wall portion 70 surrounding the portions of the cavities 25 which extend into the substrate 50. After filling the trenches 56/57 with polymer, a litho+etch process is performed for removing a portion of the polymer, the substrate material enclosed by the trench 57, and a portion of the PMD layer 2, stopping on the upper metal contact area 51 (FIG. 3e). After stripping of the litho-mask, the thereby formed opening 59 is then plated with metal (after forming a seed layer, not shown), thereby forming a through-semiconductor-via 60 (FIG. 3f). The polymer forms the liner that isolates the TSV from the substrate 50. The polymer, simultaneously deposited in the TSV trench 57 and in the trench 56 surrounding the MIMCAP, thus performs the function of isolating the MIMCAP and of isolating the TSV. After releasing the interposer from the carrier 53, contact pads 61 are formed on backside for contacting the TSV. In terms of the production of the TSV 60, the above-described process is known as the 'via-last' technique, wherein the liner is first formed and the opening for the TSV is etched after that. As shown, the isolation of the MIMCAP can be integrated in the known via-last process sequence. The isolating wall 70 may equally be formed independently from the formation of TSVs. In the embodiment shown, the layer 71 of the polymer formed on the passivation layer 55 is maintained in the final device. This layer 71 may alternatively be removed before producing the TSV 60.

An Example Implementation

Table 1 summarizes a set of preferred parameters in terms of dimensions and materials for a MIMCAP according to embodiments. With these parameters, it is possible to obtain a capacitance density of 100 nF/mm². The voltage applied to the capacitor may be between 1 and 3 V, and the breakdown voltage is estimated at 10V. It will be understood that, due to inherent process variabilities, a structure having a dimension as described in Table 1 can vary by, without limitation, e.g., +/−5%, +/−10% or +/−20%. For example, a thickness of about 600 nm may refer to a thickness range of 600+/−30 nm, 600+/−60 nm or 600+/−120 nm, according to embodiments.

TABLE 1

| Substrate 1 | material | Silicon wafer, e.g. about 770 µm thick |
|---|---|---|
| PMD | Material | Silicon oxide |
|  | thickness | 1 µm |
| M1/M2 | IMD material | A stack of SiO/SiN, 550 nm SiO with 50 nm SiN |
|  | Thickness | 600 nm |
| MIMCAP | Material conductive layers 26/28 | TiN |
|  | Material insulator 27 | $HfO_2$ |
|  | Thickness layers 26/28 | 40 nm |
|  | Thickness insulator 27 | 20 nm |
|  | Diameter cavities 25 | 2 µm |
|  | Pitch cavities 25 | 3.5 µm |
|  | Depth cavities 25 | 23 µm |
|  | Aspect ratio cavities 25 | 11.5 |

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or process, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

Unless specifically specified, the description of a layer being present, deposited or formed 'on' another layer or substrate, includes the options of said layer being present, formed or deposited directly on, i.e. in physical contact with, said other layer or substrate, and said layer being present, formed or deposited on one or a stack of intermediate layers between said layer and said other layer or substrate.

What is claimed is:

1. An integrated circuit (IC) comprising:
   a semiconductor substrate; and
   a plurality of metallization levels, each metallization level comprising a layer of intermetal dielectric having metal areas embedded therein,
   a metal-insulator-metal capacitor (MIMCAP) comprising a bottom electrode, a top electrode and a metal-insulator-metal (MIM) stack comprising a lower conductive layer, an upper conductive layer and an insulator layer sandwiched between the lower and upper conductive layers,
   wherein the bottom electrode comprises a planar metal area of a lower metallization level, the planar metal area having perforations formed therethrough,
   wherein the IC comprises cavities, each cavity extending through one of the perforations and into the semiconductor substrate, each cavity being separated from edges of a corresponding perforation by a first intermetal dielectric material of the lower metallization level,
   wherein the MIM stack comprises a planar portion of the MIM stack on at least a part of an upper surface of the bottom electrode and a plurality of non-planar portions of the MIM stack extending into the cavities, the MIM stack lining the sidewalls and bottoms of the cavities, and wherein the top electrode comprises:
a planar portion of the top electrode formed by a planar metal area of an upper metallization level adjacent to the lower metallization level, wherein the planar portion of the top electrode is formed on at least a part of an upper surface of the planar portion of the MIM stack, and wherein the planar portion of the top electrode has sidewalls lined by portions of the MIM stack, and non-planar portions of the top electrode extending from the planar portion of the top electrode into the cavities.

2. The IC according to claim 1, wherein the planar portion of the top electrode comprising a plurality of perforations formed therethrough, each perforation having a central portion formed of a second intermetal dielectric material of the upper metallization level, wherein a side wall of the central portion is surrounded by the MIM stack.

3. The IC according to claim 1, wherein a portion of the substrate at which the MIMCAP is formed is laterally separated from the remainder of the substrate by a dielectric wall portion enclosing portions of the cavities extending into the substrate.

4. The IC according claim 1, wherein the bottom electrode further comprises an additional layer of a conductive material on the planar metal area of the lower metallization level, the additional layer being provided with a plurality of perforations corresponding to the perforations formed through the planar metal area.

5. The IC according claim 1, wherein a portion of the bottom electrode laterally extends beyond the top electrode, and wherein the extended portion of the bottom electrode is contacted by a via connection in the upper metallization level.

6. The IC according to claim 1, further comprising a power delivery network, and wherein the MIMCAP is a decoupling capacitor coupled between a supply terminal and a ground terminal of the network.

7. The IC according claim 1, wherein the MIMCAP is a part of a DC/DC converter.

8. The IC according claim 1, wherein the IC is an interposer chip.

9. The IC according claim 1, wherein the lower metallization level comprises a first metallization level and the upper metallization level comprises a second metallization level.

* * * * *

UNITED STATES PATENT AND TRADEMARK OFFICE
CERTIFICATE OF CORRECTION

PATENT NO. : 10,141,394 B2
APPLICATION NO. : 15/360859
DATED : November 27, 2018
INVENTOR(S) : Mikael Detalle Page 1 of 1

It is certified that error appears in the above-identified patent and that said Letters Patent is hereby corrected as shown below:

In the Specification

In Column 5, Line 10, change "includes," to --includes--.

In Column 6, Line 51, change "(FIG." to --(FIGS.--.

In the Claims

In Column 12, Line 1, Claim 4, after "according" insert --to--.

In Column 12, Line 7, Claim 5, after "according" insert --to--.

In Column 12, Line 17, Claim 7, after "according" insert --to--.

In Column 12, Line 19, Claim 8, after "according" insert --to--.

In Column 12, Line 21, Claim 9, after "according" insert --to--.

Signed and Sealed this
Fourth Day of June, 2019

Andrei Iancu
*Director of the United States Patent and Trademark Office*